United States Patent
Fujikawa et al.

(10) Patent No.: US 7,532,036 B2
(45) Date of Patent: May 12, 2009

(54) SEMICONDUCTOR DEVICE HAVING A PSEUDO POWER SUPPLY WIRING

(75) Inventors: Atsushi Fujikawa, Tokyo (JP); Hiromasa Noda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 8 days.

(21) Appl. No.: 11/892,512

(22) Filed: Aug. 23, 2007

(65) Prior Publication Data

US 2008/0061833 A1    Mar. 13, 2008

(30) Foreign Application Priority Data

Sep. 13, 2006    (JP)    ............................. 2006-248294

(51) Int. Cl.
*H03K 19/096*    (2006.01)
*H03K 19/003*    (2006.01)

(52) U.S. Cl. .......................................... 326/98; 326/33
(58) Field of Classification Search .................... 326/83, 326/31–34, 95, 98; 327/544–547
See application file for complete search history.

(56) References Cited

U.S. PATENT DOCUMENTS

| | | | |
|---|---|---|---|
| 5,583,457 A * | 12/1996 | Horiguchi et al. | ........... 326/121 |
| 6,049,245 A | 4/2000 | Son et al. | |
| 6,208,171 B1 | 3/2001 | Kumagai et al. | |
| 6,215,159 B1 | 4/2001 | Fujita et al. | |
| 6,292,015 B1 | 9/2001 | Ooishi et al. | |
| 6,483,165 B2 | 11/2002 | Ooishi et al. | |
| 6,794,904 B2 | 9/2004 | Ooishi et al. | |
| 7,042,245 B2 | 5/2006 | Hidaka | |
| 7,145,383 B2 * | 12/2006 | Mizuno et al. | ............... 327/546 |
| 7,355,455 B2 * | 4/2008 | Hidaka | ........................ 326/121 |
| 7,359,277 B2 | 4/2008 | Hardee | |
| 7,372,765 B2 | 5/2008 | Hardee | |

FOREIGN PATENT DOCUMENTS

| | | |
|---|---|---|
| JP | 10-270993 | 10/1998 |
| JP | 11-261400 | 9/1999 |
| JP | 2000-013215 A | 1/2000 |
| JP | 2000-022515 A | 1/2000 |
| JP | 2000-048568 A | 2/2000 |
| JP | 2002-305434 A | 10/2002 |
| JP | 2004-037202 A | 2/2004 |
| JP | 2004-147175 A | 5/2004 |
| JP | 2005-086805 A | 3/2005 |
| JP | 2005-236659 A | 9/2005 |
| JP | 2007-049671 A | 2/2007 |

* cited by examiner

*Primary Examiner*—James H Cho
(74) *Attorney, Agent, or Firm*—Foley & Lardner LLP

(57) ABSTRACT

A semiconductor device includes main power supply wirings VDD and VSS, an pseudo power supply wiring VDT, inverters connected between the pseudo power supply wiring VDT and the main power supply wiring VSS, and inverters connected between the main power supply wiring VDD and the main power supply wiring VSS. Between the main power supply wiring VDD and the pseudo power supply wiring VDT, an N-channel MOS transistor and a P-channel MOS transistor that are rendered a conductive state at the time of active are connected in parallel. According to the present invention, the transistors different in conductivity type are used in parallel, and thus, it becomes possible to reduce power consumption at the time of standby while suppressing a decrease in switching speed from a standby state to an active state.

15 Claims, 7 Drawing Sheets

SEMICONDUCTOR DEVICE HAVING A PSEUDO POWER SUPPLY WIRING

TECHNICAL FIELD

The present invention relates to a semiconductor device, and particularly relates to a semiconductor device the power consumption of which can be reduced in a standby state.

BACKGROUND OF THE INVENTION

In recent years, an operating voltage of a semiconductor device has been gradually decreasing so as to reduce power consumption of the semiconductor device. Currently, some semiconductor devices use quite low operating voltages of about 1 volt. If the operating voltage decreases, it is necessary to reduce a threshold voltage of each transistor accordingly. As a result, a sub-threshold current flowing through the transistor in an off state disadvantageously increases. To solve such a problem, a method of dividing power supply wirings into a main power supply wiring and a pseudo power supply wiring have been proposed in Japanese Patent Application Laid-open Nos. 2000-13215 and 2000-48568.

FIG. 7 is a circuit diagram of a conventional semiconductor device using pseudo power supply wirings.

A circuit shown in FIG. 7 includes a circuit block 10 configured to include four stages of inverters 11 to 14. The circuit block 10 is a block the logic of which is fixed in a standby state. In the example shown in FIG. 7, a signal IN input to the circuit block 10 is fixed to high level in the standby state. Needless to say, a logic value of the input signal IN is appropriately changed into an active state.

Three power supply wirings, that is, a main power supply wiring VDD and a pseudo power supply wiring VDT to each of which a power supply potential is supplied, and a main power supply wiring VSS which a ground potential is supplied are provided for the circuit shown in FIG. 7. A P-channel MOS transistor 20 is provided between the main power supply wiring VDD and the pseudo power supply wiring VDT, and a standby signal ST is supplied to a gate electrode of the P-channel MOS transistor 20.

The standby signal ST is a signal that becomes high level when the circuit block 10 is set in the standby state, and kept to be low level when the circuit block 10 is in the active state. Due to this, in the active state, the main power supply wiring VDD is short circuited to the pseudo power supply wiring VDT via the transistor 20. On the other hand, in the standby state, the transistor 20 is turned into off state. Due to this, the pseudo power supply wiring VDT is disconnected from the power supply wiring VDD. As a result, the power supply potential is hardly supplied to the circuit block 10.

Moreover, among the four inverters 11 to 14 included in the circuit block 10, the first inverter 11 and the third inverter 13 are connected between the pseudo power supply wiring VDT and the main power supply wiring VSS. Further, the second inverter 12 and the fourth inverter 14 are connected between the main power supply wiring VDD and the main power supply wiring VSS. As described above, in the active state, the main power supply wiring VDD is shorted to the pseudo power supply wiring VDT. Accordingly, a power supply voltage is correctly applied to both power supply terminals of each of all the inverters 11 to 14, whereby the circuit block 10 can operate normally. Therefore, a signal OUT output from the circuit bock 10 has a correct value according to the logic value of the input signal IN.

Meanwhile, in the standby state, the pseudo power supply wiring VDT is disconnected from the main power supply wiring VDD. Accordingly, the power supply potential is hardly supplied to sources of P-channel MOS transistors 11p and 13p included in the first inverter 11 and the third inverter 13, respectively.

Nevertheless, because the input signal IN is fixed to the high level in the standby state, transistors that are included in the inverters 11 to 14 and that are turned into on states are fixed to an N-channel MOS transistor 11n, a P-channel MOS transistor 12p, an N-channel MOS transistor 13n, and a P-channel MOS transistor 14p shown in FIG. 7, respectively. Furthermore, sources of these transistors 11n, 12p, 13n, and 14p are connected to the main power supply wiring VDD or VSS, so that the logic of the circuit block 10 is maintained correctly in the standby state.

On the other hand, sources of the P-channel MOS transistors 11p and 13p that are turned into off states in the standby state are connected to the pseudo power supply wiring VDT disconnected from the main power supply wiring VDD. Due to this, sub-threshold current hardly flows through the P-channel MOS transistors 11p and 13p. It is thereby possible to reduce the power consumption while the circuit block 10 is in the standby state.

However, even at the time of standby state, the pseudo power supply wiring VDT and the main power supply wiring VDD are not completely cut off, and by the sub-threshold current that passes in the P-channel MOS transistor 20, a slight amount of current continues to be supplied to the pseudo power supply wiring VDT. Thus, the sub-threshold currents in the P-channel MOS transistors 11p and 13p are not completely rendered zero, and the sub-threshold current that passes in the P-channel MOS transistor 20 results in flowing into the P-channel MOS transistors 11p and 13p.

When a transistor size is rendered small, the sub-threshold current can be reduced. However, a drive capability sufficient for operating the circuit block 10 is required in the P-channel MOS transistor 20 at the time of active state. Thus, it is fundamentally difficult to render the transistor size small.

Methods for reducing the sub-threshold current that passes in the pseudo power supply wiring VDT at the time of standby state can include a method in which instead of the P-channel MOS transistor 20, an N-channel MOS transistor is used so that the gate electrode of the N-channel MOS transistor is reverse-biased with respect to the source electrode at the time of standby state.

However, if the main power supply wiring VDD and the pseudo power supply wiring VDT are connected by the N-channel MOS transistor, it is needed to supply a gate electrode with 2×VDD of a high potential at the time of active state. A signal of such a level can be generated by using a level conversion circuit or the like. However, when the signal is passed through the level conversion circuit, the signal is slightly delayed. As a result, there occurs another problem in that a timing of switching the circuit block 10 from the standby state to the active state is delayed.

SUMMARY OF THE INVENTION

The present invention has been achieved to solve such problems. It is therefore an object thereof to provide a semiconductor device capable of further reducing power consumption at the time of standby state while suppressing a decrease in switching speed from a standby state to an active state.

The above and other objects of the present invention can be accomplished by a semiconductor device comprising:
a main power supply wiring;
a pseudo power supply wiring;

a circuit block including a plurality of transistors, in which a source of at least one of the transistors that is fixed to turn off in a standby state is connected to the pseudo power supply wiring; and an N-channel MOS transistor and a P-channel MOS transistor, connected between the main power supply wiring and the pseudo power supply wiring in parallel, wherein the N-channel MOS transistor and the P-channel MOS transistor turn on in an active state.

According to the present invention, as a transistor that connects a main power supply wiring and an pseudo power supply wiring, both an N-channel MOS transistor and a P-channel MOS transistor are used, and the both transistors are rendered a conductive state at the time of active state. Thus, it becomes possible to reduce power consumption at the time of standby while suppressing a decrease in switching speed from a standby state to an active state.

That is, a difference is generated between a drive capability of the N-channel MOS transistor and that of the P-channel MOS transistor, and a larger-drive-capability side can be reverse-biased at the time of standby and a smaller-drive-capability side can be rendered a conductive state at high speed at the time of shifting to active. It suffices that to the larger-drive-capability side, a drive capability sufficient for operating the circuit block is set, and to the smaller-drive-capability side, a drive capability sufficient for recharging a wiring capacitance of the pseudo power supply wiring is set.

Thus, according to the present invention, it becomes possible to reduce power consumption at the time of standby while suppressing a decrease in switching speed from the standby state to the active state.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
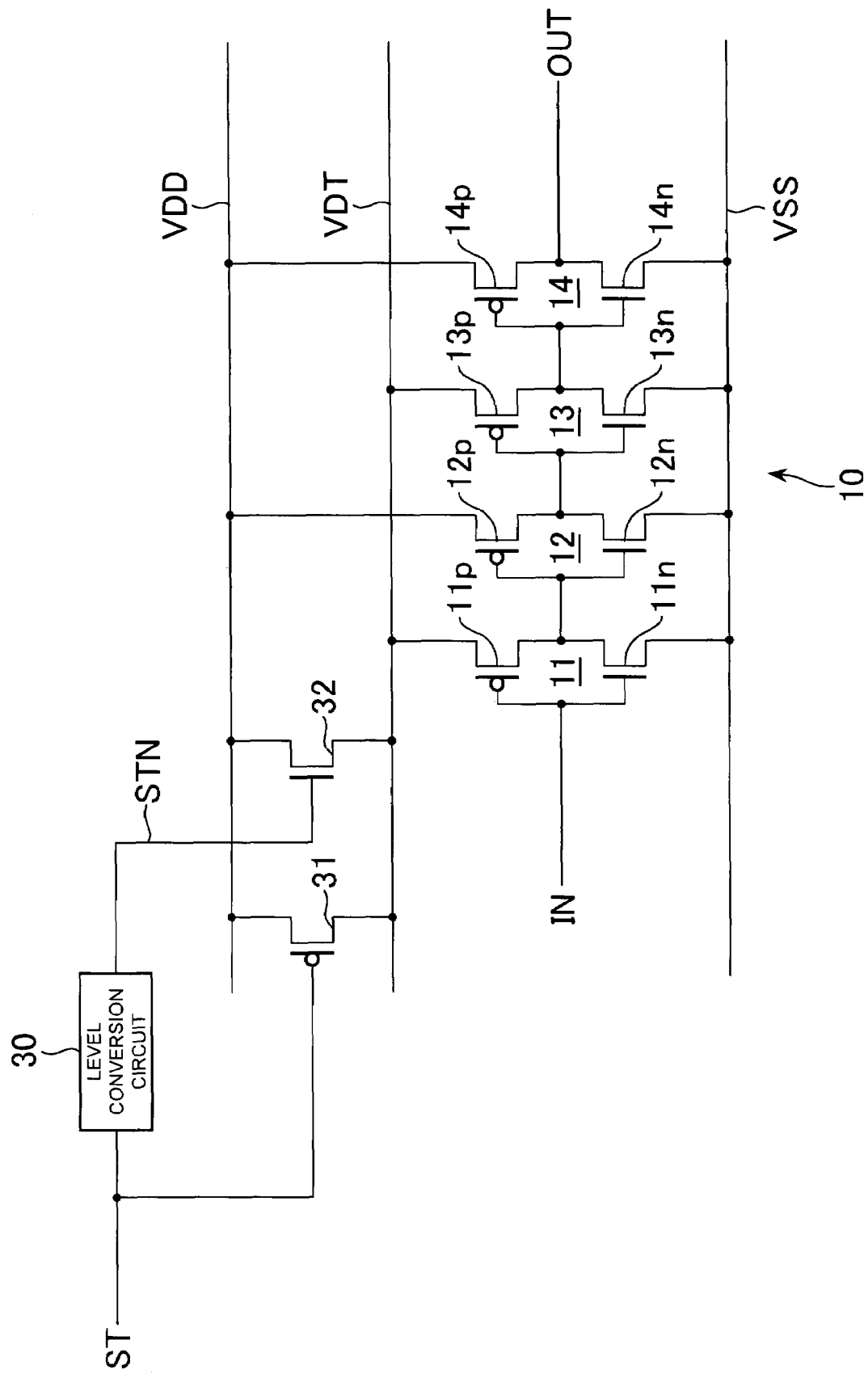
FIG. 1 is a circuit diagram of a semiconductor device according to the first embodiment of the present invention.

FIG. 1 is a circuit diagram of a semiconductor device according to the first embodiment of the present invention.

Figure 7:
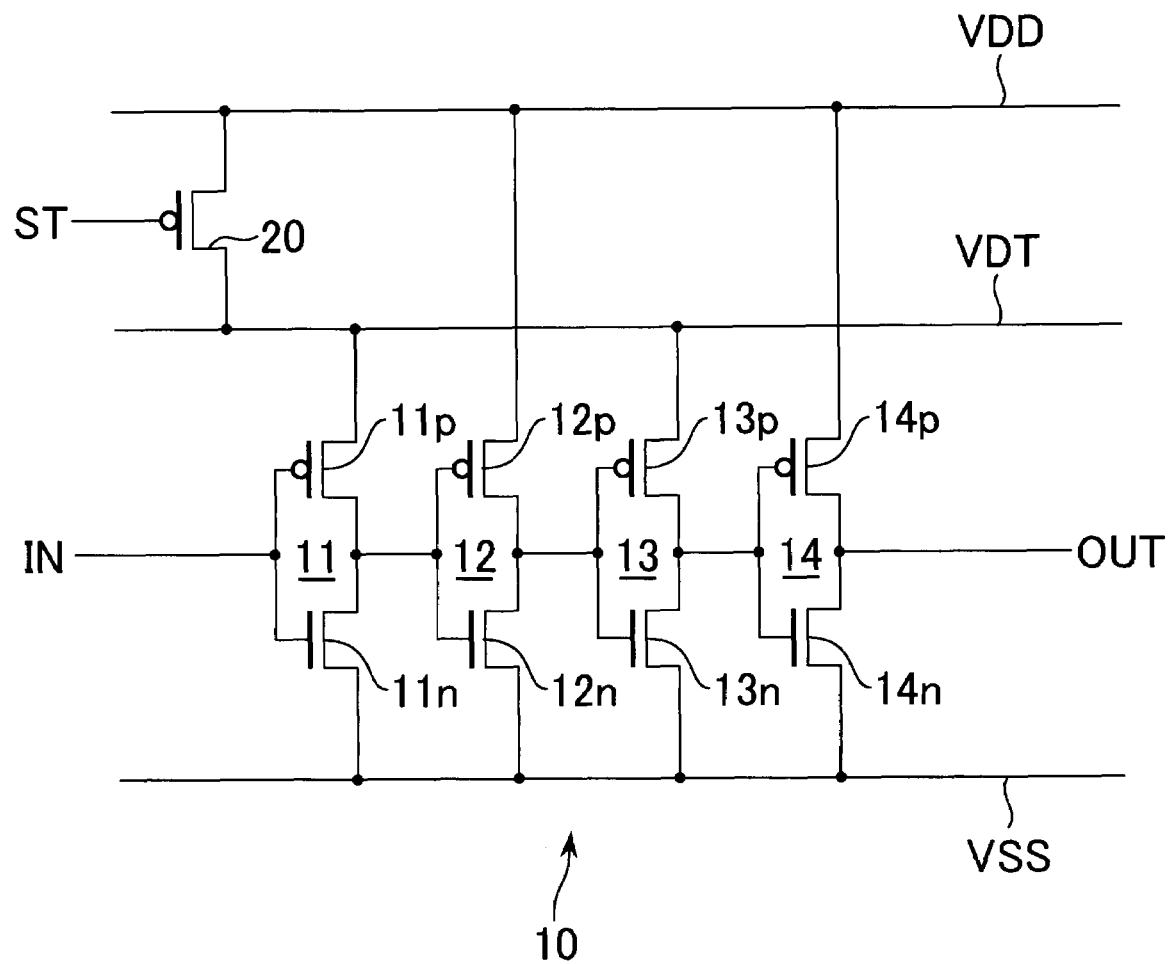
FIG. 7 is a circuit diagram of a conventional semiconductor device using pseudo power supply wirings.

As shown in FIG. 1, the semiconductor device includes the circuit block 10 configured of 4-stage inverters 11 to 14, similar to the conventional circuit shown in FIG. 7. In the circuit block 10, logic is fixed at the time of standby state, and its input signal IN is fixed to a high level at the time of standby state. Out of the four inverters 11 to 14 included in the circuit block 10, the first-stage inverter 11 and the third-stage inverter 13 are connected between the pseudo power supply wiring VDT and the main power supply wiring VSS, and the second-stage inverter 12 and the fourth-stage inverter 14 are connected between the main power supply wiring VDD and the main power supply wiring VSS.

In the present embodiment, three power wirings, that is, the main power supply wiring VDD, the pseudo power supply wiring VDT, and the main power supply wiring VSS are arranged. In the present embodiment, however, between the main power supply wiring VDD and the pseudo power supply wiring VDT, a P-channel MOS transistor 31 and an N-channel MOS transistor 32 are connected in parallel. Both the two transistors connected in parallel turn on at the time of active state. A gate electrode of the P-channel MOS transistor 31 is supplied with the standby signal ST, and a gate electrode of the N-channel MOS transistor 32 is supplied with a standby signal STN, which is output signal of a level conversion circuit 30.

In the present embodiment, a drive capability between the P-channel MOS transistor 31 and the N-channel MOS transistor 32 are significantly different. More specifically, the drive capability of the P-channel MOS transistor 31 is below a drive capability sufficient for driving the circuit block 10, and set enough for recharging a wiring capacitance of the pseudo power supply wiring VDT. That is, the P-channel MOS transistor 31 alone cannot drive the circuit block 10, and the transistor size thereof is set very small as a power-supply system driver. On the contrary, the drive capability of the N-channel MOS transistor 32 is set sufficiently for driving the circuit block 10, that is, set to a drive capability which is normally possessed by a power-supply system driver.

An actual channel width (W) depends on a circuit scale of the circuit block 10 and a wiring capacitance of the pseudo power supply wiring VDT. However, the channel width (W) preferably is set to $10 \times Wp < Wn$, and more preferably to $30 \times Wp < Wn$, where Wp is the channel width of the P-channel MOS transistor 31, and Wn is the channel width of the N-channel MOS transistor 32.

The level conversion circuit 30 receives the standby signal ST, inverts its logical value, and increases the amplitude by two.

Figure 2:
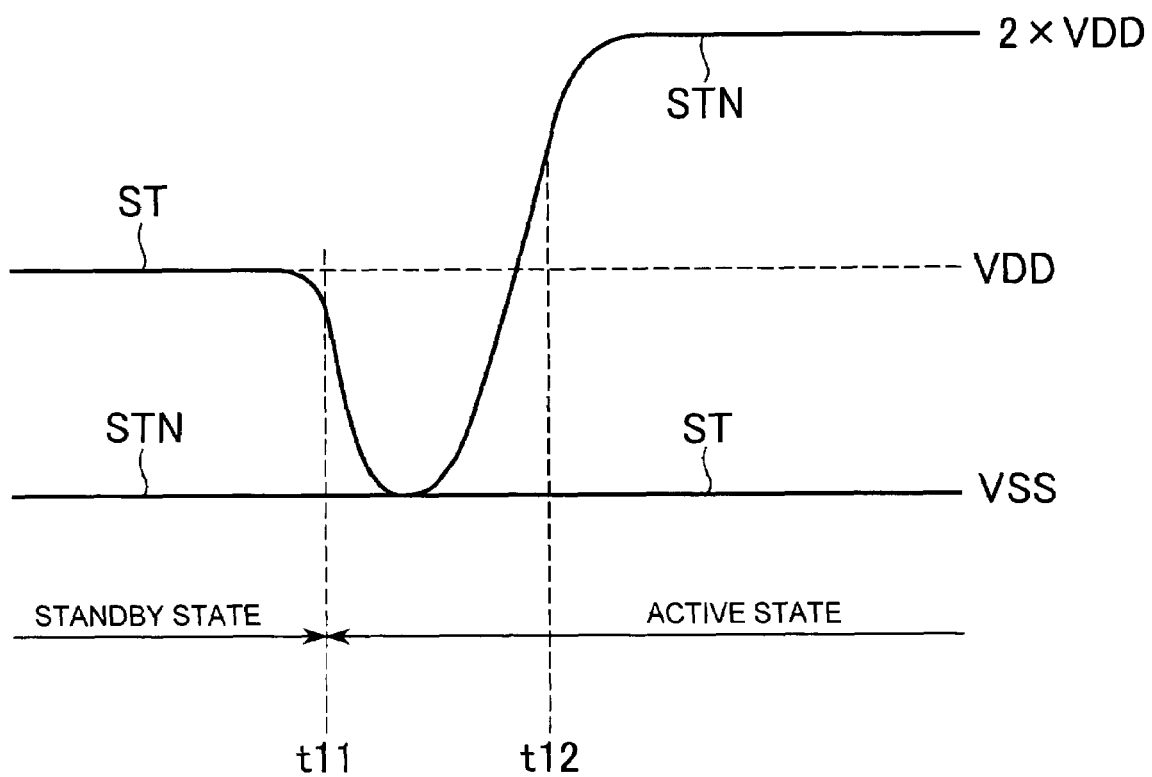
FIG. 2 is a waveform chart for describing an operation of the level conversion circuit shown in FIG. 1.

FIG. 2 is a waveform chart for describing an operation of the level conversion circuit 30.

As shown in FIG. 2, in periods before a time t11, the circuit block 10 is in a standby state, and thus, before the time t11, the standby signal ST is at a high level (=VDD). In response, the standby signal STN, which is the output of the level conversion circuit 30, is at a low level (=VSS).

Thereby, a gate potential of the P-channel MOS transistor 31 with respect to the source potential is zero, and thus, an off state is maintained. When the gate-to-source voltage is zero, a sub-threshold current can pass between the source and the drain of the P-channel MOS transistor 31. However, as described above, the current drive capability of the P-channel MOS transistor 31 is set sufficiently small, and thus, the sub-threshold current can also be suppressed to a sufficiently small level.

On the other hand, a gate potential of the N-channel MOS transistor 32 is VSS, and thus, its gate-to-source voltage is −VDD, that is, a reverse biased. Accordingly, the N-channel MOS transistor 32 remains completely off state, and the sub-threshold current is nearly zero.

Next, when the standby signal ST is changed to a low level (=VSS) to render the circuit block 10 an active state at the time t11, the standby signal STN, which is the output of the level conversion circuit 30, is changed to a high level (=2×

VDD). However, such a level conversion requires a certain amount of time. Thus, a change timing of the standby signal ST and a change timing of the standby signal STN do not completely coincide. As a result, the standby signal STN rises at a time t12, which is delayed by a predetermined time from the time t11.

Accordingly, in the period from the time t11 to the time t12, the P-channel MOS transistor 31 is in an on state, and the N-channel MOS transistor 32 is in an off state. The pseudo power supply wiring VDT is recharged by small drive capability of the P-channel MOS transistor 31. The P-channel MOS transistor 31 has a very small drive capability, but has a sufficient drive capability for recharging the wiring capacitance of the pseudo power supply wiring VDT, as described above. Thus, the pseudo power supply wiring VDT immediately rises to a VDD level, and the circuit block 10 is rendered capable of receiving the input signal IN.

Next, when the time t12 is reached, the gate-to-source voltage of the N-channel MOS transistor 32 is rendered VDD (=2×VDD−VDD). Thus, the N-channel MOS transistor 32 is rendered an on state, and the pseudo power supply wiring VDT is strongly driven. As a result, when the circuit block 10 is actually supplied the input signal IN, the circuit block 10 in an active state correctly performs switching, and in response thereto, generates an output signal OUT.

As described above, in the semiconductor device according to the present embodiment, the P-channel MOS transistor 31 and the N-channel MOS transistor 32 are connected in parallel between the main power supply wiring VDD and the pseudo power supply wiring VDT, and these transistors turn on at the time of active state. On the other hand, these transistors are kept to off state at the time of standby state. Thereby, a switching speed from the standby state to the active state is ensured by the P-channel MOS transistor 31, and the N-channel MOS transistor 32 in which drive capability is large is reverse-biased at the time of standby state. Thus, it becomes possible to significantly reduce the power consumption at the time of standby state.

A second embodiment of the present invention is described next.

Figure 3:
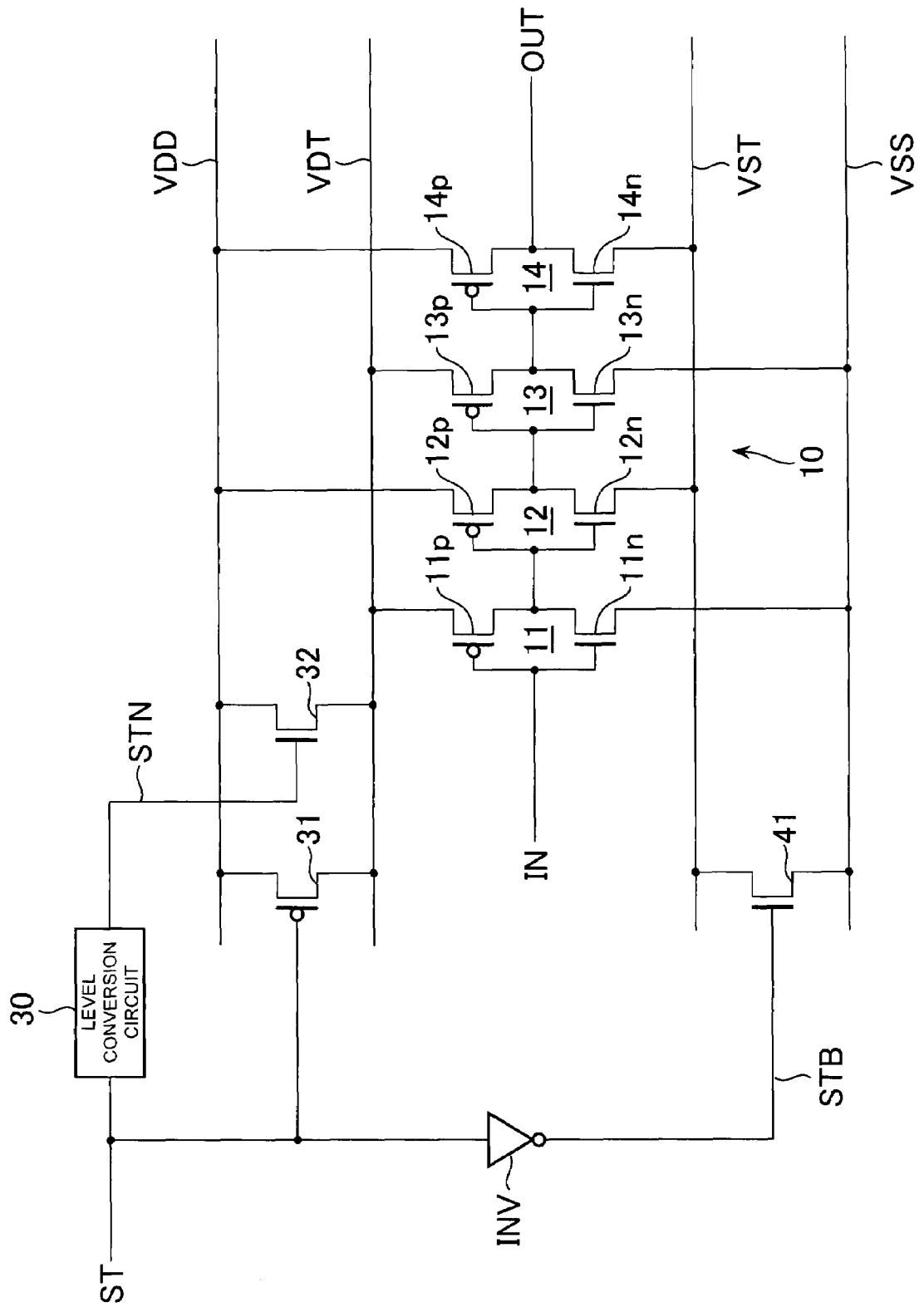
FIG. 3 is a circuit diagram of a semiconductor device according to the second embodiment of the present invention.

FIG. 3 is a circuit diagram of a semiconductor device according to the second embodiment of the present invention.

As shown in FIG. 3, the semiconductor device according to the present embodiment further includes an pseudo power supply wiring VST and an N-channel MOS transistor 41 arranged between the main power supply wiring VSS and the pseudo power supply wiring VST. A gate electrode of the N-channel MOS transistor 41 is supplied via an inverter INV with an inverted standby signal STB.

In the present embodiment, out of the four inverters 11 to 14 included in the circuit block 10, the first-stage inverter 11 and the third-stage inverter 13 are connected between the pseudo power supply wiring VDT and the main power supply wiring VSS, and the second-stage inverter 12 and the fourth-stage inverter 14 are connected between the main power supply wiring VDD and the pseudo power supply wiring VST. Since other configurations are the same as those in the first embodiment, the same parts are designated by the same reference numerals, and redundant descriptions thereof will be omitted.

The N-channel MOS transistor 41 has a drive capability sufficient for driving the circuit block 10. That is, a drive capability of the N-channel MOS transistor 41 is normally possessed by a power-supply system driver.

In the present embodiment, the N-channel MOS transistor 41 turns off at the time of standby state. As a result, at the time of standby state, sources of N-channel MOS transistors 12n and 14n included in the second-stage inverter 12 and the fourth-stage inverter 14 are supplied nearly no ground potential.

However, as described above, the input signal IN is fixed to a high level at the time of standby state, and sources of the transistors that should turn on, out of the transistors configuring each of the inverters 11 to 14, are surely connected to the main power supply wiring VDD or the main power supply wiring VSS. Thus, the logic at the time of standby state is correctly maintained. Sources of the N-channel MOS transistors 12n and 14n rendered an off state at the time of standby state are connected to the pseudo power supply wiring VST separated from the main power supply wiring VSS, and thus, nearly no sub-threshold current passes. Thereby, it becomes possible to further reduce the power consumption when the circuit block 10 is at the time of standby state.

A third embodiment of the present invention is described next.

Figure 4:
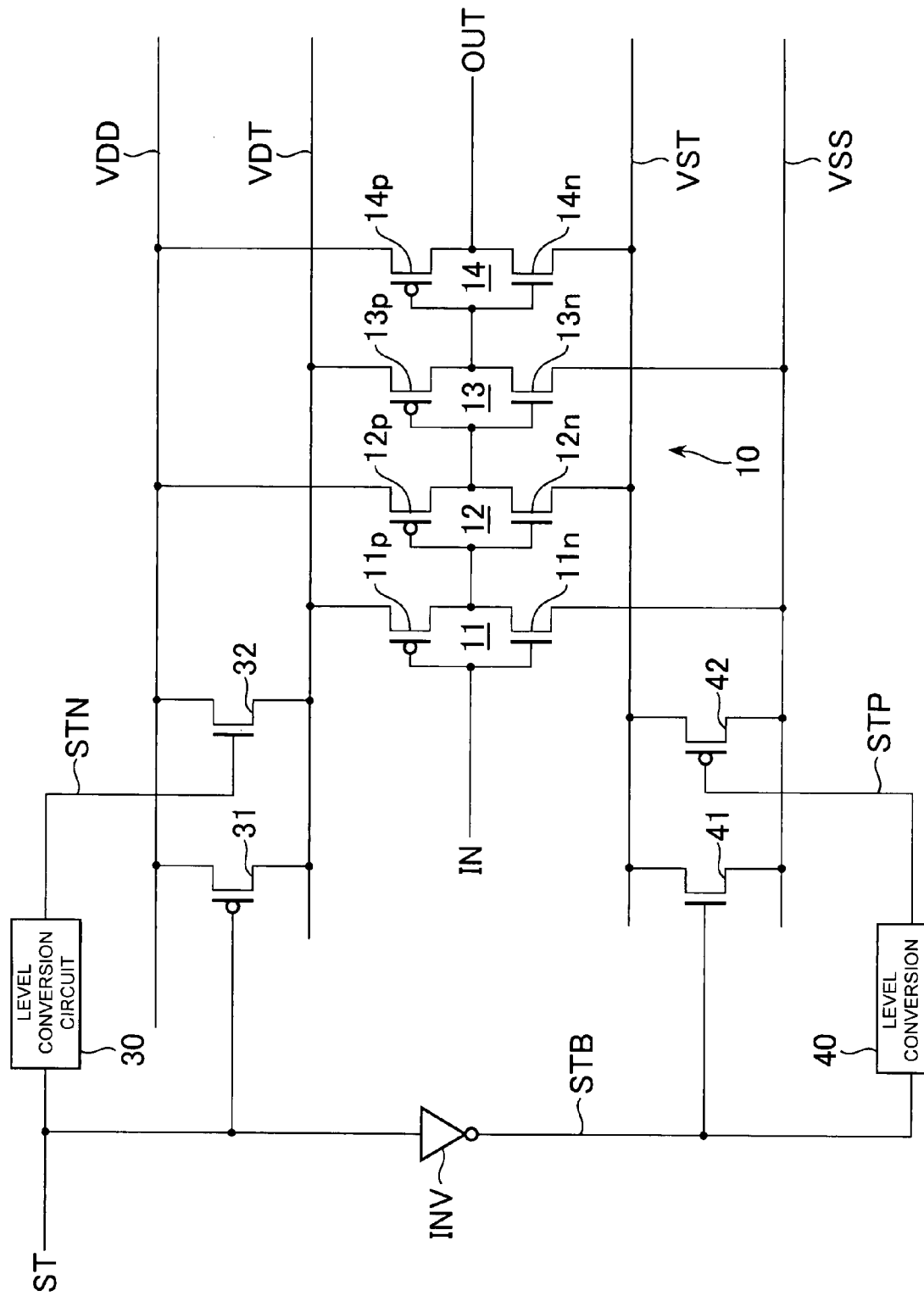
FIG. 4 is a circuit diagram of a semiconductor device according to the third embodiment of the present invention.

FIG. 4 is a circuit diagram of a semiconductor device according to the third embodiment of the present invention.

As shown in FIG. 4, the semiconductor device of the present embodiment differs from the semiconductor device according to the second embodiment shown in FIG. 3 in that the former includes: a P-channel MOS transistor 42 connected between the main power supply wiring VSS and the pseudo power supply wiring VST; and a level conversion circuit 40 that supplies a standby signal STP to a gate electrode of the P-channel MOS transistor 42. Since other configurations are the same as those in the second embodiment, the same parts are designated by the same reference numerals, and redundant descriptions thereof will be omitted.

In the present embodiment, a large difference is given between a drive capability of the N-channel MOS transistor 41 and that of the P-channel MOS transistor 42. That is, similar to the P-channel MOS transistor 31, a drive capability of the N-channel MOS transistor 41 is below a drive capability sufficient for driving the circuit block 10, and set sufficiently for recharging a wiring capacitance of the pseudo power supply wiring VST. That is, as a power-supply system driver, the drive capability is set very small. On the contrary, to a drive capability of the P-channel MOS transistor 42, a sufficient drive capability for driving the circuit block 10, that is, a drive capability which is normally possessed by the power-supply system driver, is set.

In receipt of the standby signal STB, the level conversion circuit 40 inverts its logical value and increases the amplitude by two.

Figure 5:
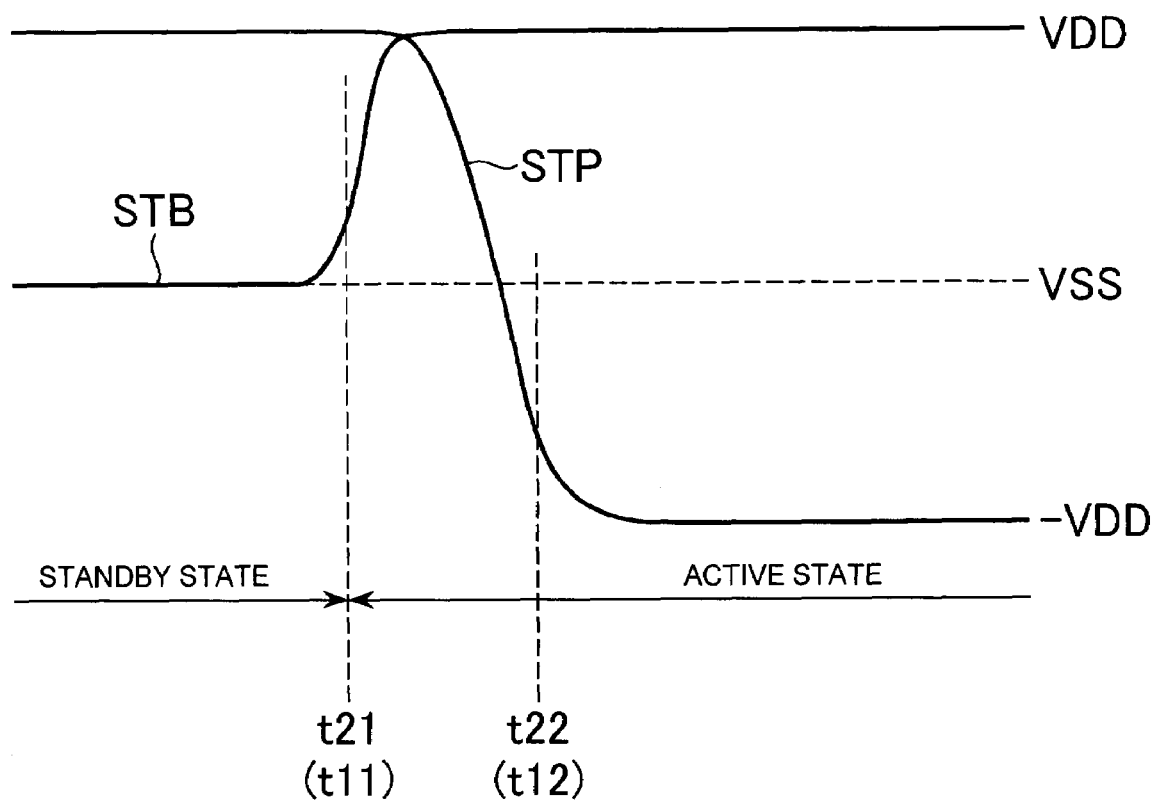
FIG. 5 is a waveform chart for describing an operation of the level conversion circuit shown in FIG. 4.

FIG. 5 is a waveform chart for describing an operation of the level conversion circuit 40.

As shown in FIG. 5, in periods before a time t21 (≈t11) the circuit block 10 is in a standby state, and thus, before the time t21, the standby signal STB is at a low level (=VSS) In response thereto, the standby signal STP, which is output of the level conversion circuit 40, is at a high level (=VDD)

Thereby, a gate-to-source voltage of the N-channel MOS transistor 41 is zero, and thus, an off state is maintained. When the gate-to-source voltage is zero, a sub-threshold current can pass between the source and a drain. However, as described above, the current drive capability of the N-channel MOS transistor 41 is set sufficiently small, and thus, the sub-threshold current can also be suppressed to a sufficiently small level.

On the other hand, a gate potential of the P-channel MOS transistor 42 is VDD, and thus, its gate-to-source voltage is +VDD, that is, a reverse bias. Accordingly, the P-channel MOS transistor 42 remains off, and the sub-threshold current is nearly zero.

Next, when the standby signal STB is changed to a high level (=VDD) to render the circuit block 10 an active state at the time t21, the standby signal STP, which is the output of the level conversion circuit 40, is changed to a low level (=−VDD). As described above, such a level conversion requires a certain amount of time. As a result, the standby signal STP falls at a time t22 (≈t12), which is delayed by a predetermined time from the time t21.

Accordingly, in the period from the time t21 to the time t22, the N-channel MOS transistor 41 is in an on state, and the P-channel MOS transistor 42 is in an off state. By the drive capability of the N-channel MOS transistor 41, the pseudo power supply wiring VST is recharged. As described in the first embodiment, in the period (the period from the time t11 to time t12), the pseudo power supply wiring VDT is recharged by the drive capability of the P-channel MOS transistor 31. Thereby, the levels of the pseudo power supply wirings VDT and VST are a power supply potential and a ground potential, respectively, and the circuit block 10 is rendered capable of receiving the input signal IN.

Next, when the time t22 is reached, a gate-to-source voltage of the P-channel MOS transistor 42 is rendered −VDD. Thus, the P-channel MOS transistor 42 is rendered a conductive state, and the pseudo power supply wiring VST is strongly driven. As a result, when the circuit block 10 is actually supplied the input signal IN, the circuit block 10 in an active state correctly performs switching, and in response thereto, generates an output signal OUT.

Thus, in the semiconductor device according to the present embodiment, between the main power supply wiring VDD and the pseudo power supply wiring VDT, the P-channel MOS transistor 31 and the N-channel MOS transistor 32 are connected in parallel. In addition, between the main power supply wiring VSS and the pseudo power supply wiring VST, the N-channel MOS transistor 41 and the P-channel MOS transistor 42 also are connected in parallel. Thereby, the transistors 32 and 42 of a large drive capability on both a higher potential side and a lower potential side are reverse-biased at the time of standby state. Thus, it becomes possible to further reduce the power consumption at the time of standby state.

A fourth embodiment of the present invention is described next.

Figure 6:
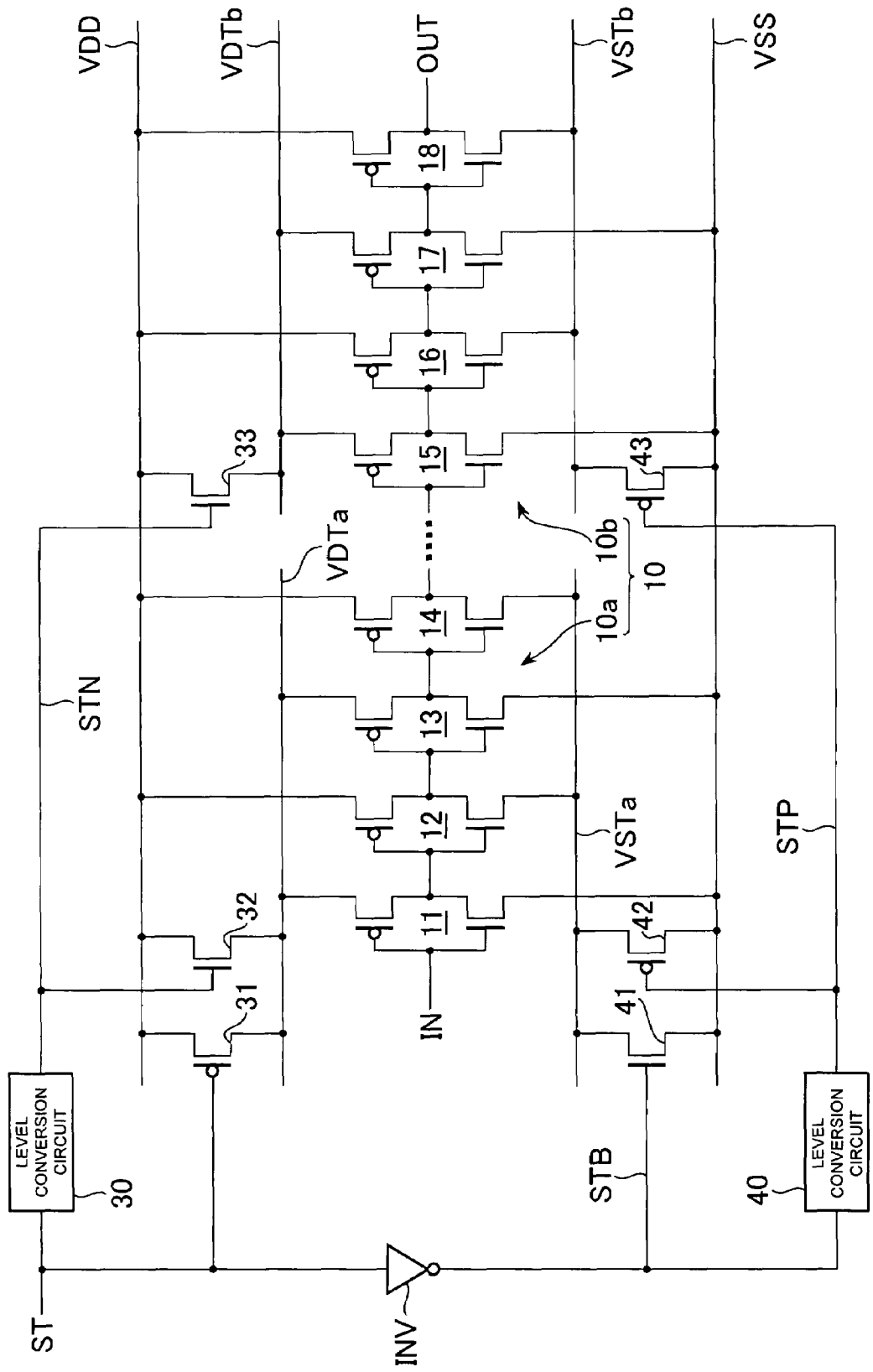
FIG. 6 is a circuit diagram of a semiconductor device according to the fourth embodiment of the present invention.

FIG. 6 is a circuit diagram of a semiconductor device according to the fourth embodiment of the present invention.

As shown in FIG. 6, in the semiconductor device according to the present embodiment, both the pseudo power supply wirings VDT and VST are divided in two. More specifically, the semiconductor device according to the present embodiment is configured of: pseudo power supply wirings VDTa and VSTa, which correspond to a preceding-stage unit 10a (a unit configured of the inverters 11 to 14) of the circuit block 10; and pseudo power supply wirings VDTb and VSTb, which correspond to a succeeding-stage unit 10b (a unit configured of the inverters 15 to 18) of the circuit block 10. The main power supply wirings VDD and VSS are not divided, and are common to the preceding-stage unit 10a and the succeeding-stage unit 10b of the circuit block 10.

Between the main power supply wiring VDD, and the pseudo power supply wiring VDTa of the preceding-stage unit, the P-channel MOS transistor 31 and the N-channel MOS transistor 32 are connected in parallel, similar to the embodiments described above. Between the main power supply wiring VSS, and the pseudo power supply wiring VSTa of the preceding-stage unit, the N-channel MOS transistor 41 and the P-channel MOS transistor 42 are connected in parallel, similar to the third embodiment shown in FIG. 4.

Meanwhile, in the present embodiment, between the main power supply wiring VDD and the pseudo power supply wiring VDTb of the succeeding-stage unit, only an N-channel MOS transistor 33 of which gate electrode is supplied the standby signal STN is connected. A transistor that corresponds to the P-channel MOS transistor 31 is not connected in parallel. Likewise, between the main power supply wiring VSS, and the pseudo power supply wiring VSTb of the succeeding-stage unit, only a P-channel MOS transistor 43 of which gate electrode is supplied the standby signal STP is connected. A transistor that corresponds to the N-channel MOS transistor 41 is not connected in parallel. To drive capabilities of the N-channel MOS transistor 33 and the P-channel MOS transistor 43, drive capabilities sufficient for driving the succeeding-stage unit 10b of the circuit block 10 are set.

Thus, in the present embodiment, the transistor for recharging at high speed the pseudo power supply wirings VDTb and VSTb are omitted. However, a predetermined amount of time is required for the input signal IN to reach the succeeding-stage unit 10b of the circuit block 10. Thus, it is possible to say that even in a case of shifting from the standby state to the active state, the pseudo power supply wirings VDTb and VSTb do not need to be driven in a time lag period generated until the input signal IN reaches the succeeding-stage unit 10b. In view of these points, in the present embodiment, the P-channel MOS transistor is not connected between the main power supply wiring VDD and the pseudo power supply wiring VDTb of the succeeding-stage unit, and the N-channel MOS transistor is not connected between the main power supply wiring VSS and the pseudo power supply wiring VSTb of the succeeding-stage unit. Thereby, in the succeeding-stage unit 10b of the circuit block 10, the sub-threshold current at the time of standby is nearly zero.

In the semiconductor device, the pseudo power supply wirings VDT and VST are divided in two, and thus, the wiring capacitances of the pseudo power supply wirings VDTa and VSTa that correspond to the preceding-stage unit 10a are reduced in about half. Thus, the drive capabilities of the P-channel MOS transistor 31 and the N-channel MOS transistor 41 for recharging the wiring capacitances can be reduced by about half. Accordingly, in the preceding-stage unit 10a of the circuit block 10, it is possible to reduce the sub-threshold current at the time of standby about half that of the third embodiment.

The present invention is in no way limited to the aforementioned embodiments, but rather various modifications are possible within the scope of the invention as recited in the claims, and naturally these modifications are included within the scope of the invention.

For example, in the above embodiments, the circuit block 10 is configured of the inverters. Needless to say, however, a logical gate circuit that configures the circuit block in the present invention is not limited to the inverter. Various logical gate circuits can be used.

In the embodiments, power supply terminals of a plurality of inverters 11 to 14 dependently connected are alternately connected to the main power supply wiring and the pseudo power supply wiring. Such a connection mode is not always required, and all the power supply terminals of the plurality of inverters dependently connected can be connected to the pseudo power supply wiring, for example.

What is claimed is:

1. A semiconductor device comprising:
a main power supply wiring;
a pseudo power supply wiring;
a circuit block including a plurality of transistors, in which a source of at least one of the transistors that is fixed to turn off in a standby state is connected to the pseudo power supply wiring; and
first and second transistors connected in parallel between the main power supply wiring and the pseudo power supply wiring, turning on in an active state, and turning off in a standby state,
wherein:
the first transistor has a first conductivity type;
the second transistor has a second conductivity type different from the first conductivity type; and
a source of at least one of the transistors included in the circuit block that is fixed to turn on in the standby state is connected to the main power supply wiring.

2. The semiconductor device as claimed in claim 1, wherein the second transistor has a gate-to-source voltage being applied a reverse bias in the standby state, and the second transistor has a drive capability larger than the first transistor.

3. The semiconductor device as claimed in claim 2, wherein a drive capability of the first transistor is set below a drive capability sufficient for operating the circuit block.

4. The semiconductor device as claimed in claim 3, wherein the drive capability of the first transistor is set to a drive capability enough for recharging a wiring capacitance of the pseudo power supply wiring.

5. The semiconductor device as claimed in claim 1, wherein:
the main power supply wiring includes a first main power supply wiring to which a relatively high potential is supplied and a second main power supply wiring to which a relatively low potential is supplied,
the pseudo power supply wiring includes a first pseudo power supply wiring that corresponds to the first main power supply wiring and a second pseudo power supply wiring that corresponds to the second main power supply wiring,
the first transistor includes a first N-channel MOS transistor connected between the first main power supply wiring and the first pseudo power supply wiring, and a second N-channel MOS transistor connected between the second main power supply wiring and the second pseudo power supply wiring,
the second transistor includes a first P-channel MOS transistor connected between the first main power supply wiring and the first pseudo power supply wiring, and a second P-channel MOS transistor connected between the second main power supply wiring and the second pseudo power supply wiring, and
the plurality of transistors included in the circuit block are divided into a first portion and a second portion, the transistors belonging to the first portion is connected between the first main power supply wiring and the second pseudo power supply wiring, the transistors belonging to the second portion is connected between the second main power supply wiring and the first pseudo power supply wiring.

6. The semiconductor device as claimed in claim 5, wherein the first N-channel MOS transistor and the second P-channel MOS transistor are applied a reverse bias to a gate-to-source voltage in the standby state.

7. The semiconductor device as claimed in claim 5, wherein the first N-channel MOS transistor has a drive capability larger than that of the first P-channel MOS transistor, and the second P-channel MOS transistor has a drive capability larger than that of the second N-channel MOS transistor.

8. The semiconductor device as claimed in claim 1, wherein the pseudo power supply wiring is divided into a first portion that supplies electricity relatively to a preceding-stage unit of the circuit block and a second portion that supplies electricity relatively to a succeeding-stage unit of the circuit block, and the first transistor and the second transistor are connected in parallel between the main power supply wiring and the first portion of the pseudo power supply wiring.

9. The semiconductor device as claimed in claim 8, wherein between the main power supply wiring and the second portion of the pseudo power supply wiring, either one of another first transistor or another second transistor is arranged.

10. The semiconductor device as claimed in claim 1, wherein:
the first and second transistors turn on in order in response to changing from a standby state to an active state; and
a drive capability of the second transistor is larger than that of the first transistor.

11. A semiconductor device comprising:
a main power supply wiring;
a pseudo power supply wiring;
a circuit block including a plurality of transistors, in which a source of at least one of the transistors that is fixed to turn off in a standby state is connected to the pseudo power supply wiring; and
first and second transistors connected in parallel between the main power supply wiring and the pseudo power supply wiring;
wherein:
the first transistor has a first conductivity type;
the second transistor has a second conductivity type different from the first conductivity type;
a source of at least one of the transistors included in the circuit block that is fixed to turn on in the standby state is connected to the main power supply wiring; and
the first and second transistors receive different phase signals from each other.

12. The semiconductor device as claimed in claim 11, wherein an amplitude of the signal supplied to the first transistor and an amplitude of the signal supplied to the second transistor differ from each other.

13. The semiconductor device as claimed in claim 11, further comprising a level conversion circuit that converts a level of the signal to be supplied to one of the first transistor and the second transistor.

14. A semiconductor device comprising:
a main power supply wiring;
a pseudo power supply wiring;
a logical gate circuit comprising a first power node and a second power node; and
first and second transistors connected in parallel between the main power supply wiring and the pseudo power supply wiring,
wherein:
the first power node is connected to the pseudo power supply wiring, and the second power node is connected to the main power supply wiring, the first and second transistors turn on in order in response to changing from a standby state to an active state, a conductivity type of the first transistor and that of the second transistor differ from each other, and a drive capability of the second transistor is larger than that of the first transistor.

15. The semiconductor device as claimed in claim 14, further comprising a level conversion circuit that reverse-biases the second transistor in the standby state.

* * * * *